(12) United States Patent
Haraldsson et al.

(10) Patent No.: US 7,227,434 B2
(45) Date of Patent: Jun. 5, 2007

(54) TUNING SCREW ASSEMBLY

(75) Inventors: Tony Haraldsson, Täby (SE); Joakim Östin, Stockholm (SE); Claes-Göran Löwenborg, Vaxholm (SE)

(73) Assignee: Allgon AB, Taby (SE)

( * ) Notice: Subject to any disclaimer, the term of this patent is extended or adjusted under 35 U.S.C. 154(b) by 0 days.

(21) Appl. No.: 10/332,373

(22) PCT Filed: Jul. 9, 2001

(86) PCT No.: PCT/SE01/01595

§ 371 (c)(1),
(2), (4) Date: Sep. 9, 2003

(87) PCT Pub. No.: WO02/06686

PCT Pub. Date: Jan. 24, 2002

(65) Prior Publication Data

US 2004/0028501 A1 Feb. 12, 2004

(30) Foreign Application Priority Data

Jul. 14, 2000 (SE) .................................. 0002665

(51) Int. Cl.
*H01P 7/06* (2006.01)
(52) U.S. Cl. ...................... 333/232; 333/325; 333/202; 333/235; 331/96; 411/437
(58) Field of Classification Search ........ 411/437–438, 411/428, 446–449, 479, 514, 947, 519, 42, 411/55, 8–9, 30, 34–36, 283–291; 338/226; 334/11, 78, 80, 82, 85; 174/35; 333/232, 333/231, 235

See application file for complete search history.

(56) References Cited

U.S. PATENT DOCUMENTS

| 134,489 | A | * | 12/1872 | Rouse | 411/286 |
| 327,773 | A | * | 10/1885 | Crane | 411/288 |
| 1,033,778 | A | * | 7/1912 | Bonness | 411/287 |
| 1,052,601 | A | * | 2/1913 | Luyties | 411/290 |
| 1,123,505 | A | * | 1/1915 | Eilers | 411/290 |
| 1,291,114 | A | * | 1/1919 | Pickin | 411/285 |
| 1,299,702 | A | * | 4/1919 | Glass | 411/291 |
| 1,561,119 | A | * | 11/1925 | Smith | 464/60 |
| 1,561,679 | A | * | 11/1925 | Woodring et al. | 411/428 |
| 1,760,113 | A | * | 5/1930 | Brown | 411/291 |
| 1,833,563 | A | * | 11/1931 | Easter | 411/291 |
| RE20,915 | E | * | 11/1938 | Bergstrom | 411/291 |

(Continued)

FOREIGN PATENT DOCUMENTS

EP 0174646 A1 * 9/1984
GB 2077876 12/1981

OTHER PUBLICATIONS http://www.repeater-builder.com/ge/mastrllcasting.html.*
US 7,053,734, 05/2006, Ala-Kojola (withdrawn)*

*Primary Examiner*—Robert J. Sandy
*Assistant Examiner*—Jeffrey A. Sharp
(74) *Attorney, Agent, or Firm*—Dickstein Shapiro LLP

(57) ABSTRACT

The present invention relates to a tuning screw assembly comprising a sleeve (100) with internal threads for engaging a tuning screw (200) having external threads. The sleeve comprises a first threaded portion (32) which is axially displaced in relation to a second threaded portion (34) for frictionally locking said screw body in said sleeve. The invention also relates to a method of manufacturing said friction locking sleeve and to a resonator comprising said friction locking sleeve.

18 Claims, 8 Drawing Sheets

U.S. PATENT DOCUMENTS

| | | | |
|---|---|---|---|
| 2,142,819 A * | 1/1939 | Olson | 411/288 |
| 2,142,820 A * | 1/1939 | Olson | 411/288 |
| 2,213,353 A * | 9/1940 | Whitcombe | 411/288 |
| 2,231,130 A * | 2/1941 | Lehre | 411/285 |
| 2,235,405 A * | 3/1941 | Markey | 411/280 |
| 2,243,515 A * | 5/1941 | Van Sant | 411/291 |
| 2,260,531 A * | 10/1941 | Luce | 411/288 |
| 2,267,935 A * | 12/1941 | Markey | 411/280 |
| 2,271,267 A * | 1/1942 | Lehre | 411/291 |
| 2,286,895 A * | 6/1942 | Carlson | 411/291 |
| 2,304,310 A * | 12/1942 | Luce | 411/288 |
| 2,306,806 A * | 12/1942 | Hoopes | 411/289 |
| 2,367,259 A * | 1/1945 | Beach | 411/285 |
| 2,381,111 A * | 8/1945 | Chandler | 411/280 |
| 2,390,662 A * | 12/1945 | Perry | 411/291 |
| 2,391,513 A * | 12/1945 | Randall | 411/289 |
| 2,391,712 A * | 12/1945 | King et al. | 470/19 |
| 2,391,902 A * | 1/1946 | Hosking | 411/288 |
| 2,421,254 A * | 5/1947 | Froelich | 403/197 |
| 2,422,833 A * | 6/1947 | King et al. | 411/285 |
| 2,472,421 A * | 6/1949 | Hamill et al. | 403/21 |
| 2,486,129 A * | 10/1949 | De Walt et al. | 333/229 |
| 2,487,219 A * | 11/1949 | Butler | 411/290 |
| 2,533,912 A * | 12/1950 | Bels | 333/234 |
| 2,716,222 A * | 8/1955 | Smullin | 333/229 |
| 2,790,151 A * | 4/1957 | Riblet | 333/229 |
| 3,152,312 A * | 10/1964 | Johnson | 336/176 |
| 3,160,825 A * | 12/1964 | Derr | 330/49 |
| 3,261,043 A * | 7/1966 | Guthmann | 470/25 |
| 3,265,109 A * | 8/1966 | Hanfland | 411/291 |
| 3,311,839 A * | 3/1967 | Rutulis | 330/4.9 |
| 3,385,339 A * | 5/1968 | Dahl | 411/288 |
| 3,404,596 A * | 10/1968 | Ryder | 411/36 |
| 3,417,801 A * | 12/1968 | Berberian | 411/278 |
| 3,444,486 A * | 5/1969 | Stepura et al. | 333/232 |
| 3,623,146 A * | 11/1971 | Kaneko et al. | 331/96 |
| 3,733,567 A * | 5/1973 | Johnson | 333/234 |
| 3,929,023 A | 12/1975 | Ambruoso, Sr. | |
| 4,001,737 A | 1/1977 | Scott | |
| 4,035,749 A * | 7/1977 | Slocum et al. | 333/232 |
| 4,127,834 A * | 11/1978 | Stringfellow et al. | 333/229 |
| 4,178,562 A * | 12/1979 | Torma et al. | 331/84 |
| 4,205,286 A * | 5/1980 | Parish | 333/226 |
| 4,206,060 A * | 6/1980 | Yamamoto et al. | 508/118 |
| 4,287,494 A * | 9/1981 | Hashimoto et al. | 333/202 |
| 4,306,816 A * | 12/1981 | Folland | 366/119 |
| 4,345,863 A * | 8/1982 | Mochida et al. | 411/252 |
| 4,380,747 A * | 4/1983 | Curtinot et al. | 333/202 |
| 4,400,650 A * | 8/1983 | Giebeler, Jr. | 315/5.41 |
| 4,477,788 A * | 10/1984 | Collinet et al. | 333/235 |
| 4,521,754 A * | 6/1985 | Ranghelli et al. | 333/224 |
| 4,535,308 A * | 8/1985 | Znojkiewicz | 333/232 |
| 4,564,375 A * | 1/1986 | Munk et al. | 96/364 |
| 4,565,979 A * | 1/1986 | Fiedziuszko | 331/117 D |
| 4,613,264 A * | 9/1986 | McIntyre et al. | 411/55 |
| 4,618,836 A * | 10/1986 | Gannon et al. | 331/96 |
| 4,628,283 A * | 12/1986 | Reynolds | 331/68 |
| 4,647,883 A * | 3/1987 | Oxley | 333/245 |
| 4,661,790 A * | 4/1987 | Gannon et al. | 333/234 |
| 4,686,496 A * | 8/1987 | Syrett et al. | 333/202 |
| 4,746,883 A * | 5/1988 | Sauvage et al. | 333/202 |
| 4,766,398 A * | 8/1988 | Kiedrowski | 331/96 |
| 4,769,620 A * | 9/1988 | Nicotra | 331/96 |
| 4,775,847 A * | 10/1988 | Epsom et al. | 333/226 |
| 4,794,340 A * | 12/1988 | Ogasawara | 315/503 |
| 4,814,729 A * | 3/1989 | Becker | 333/24 C |
| 4,862,111 A * | 8/1989 | Mettoudi et al. | 331/96 |
| 4,926,142 A * | 5/1990 | Mettoudi | 331/99 |
| 4,954,032 A * | 9/1990 | Morales | 411/289 |
| 4,956,617 A * | 9/1990 | Bowlds | 331/96 |
| 4,963,841 A * | 10/1990 | Sparagna | 333/202 |
| 4,984,946 A * | 1/1991 | Phillips, II | 411/34 |
| 5,039,966 A * | 8/1991 | Schmid et al. | 333/229 |
| 5,157,337 A * | 10/1992 | Neel et al. | 324/632 |
| 5,237,299 A * | 8/1993 | Chandler et al. | 333/233 |
| 5,495,145 A * | 2/1996 | Pingree, Jr. | 315/39.61 |
| 5,634,753 A * | 6/1997 | Goellner | 411/288 |
| 5,662,443 A * | 9/1997 | Dziaba | 411/291 |
| 5,712,723 A * | 1/1998 | Lee | 359/328 |
| 5,782,597 A * | 7/1998 | Meyer | 411/433 |
| 5,825,267 A * | 10/1998 | Smith | 333/235 |
| 5,859,576 A * | 1/1999 | Winandy | 333/232 |
| 5,915,902 A * | 6/1999 | Patterson et al. | 411/291 |
| 5,986,526 A * | 11/1999 | Kopal et al. | 333/232 |
| 6,107,900 A * | 8/2000 | Satoh et al. | 333/219.1 |
| 6,198,366 B1 * | 3/2001 | Dahl et al. | 333/235 |
| 6,222,428 B1 * | 4/2001 | Akesson et al. | 333/202 |
| 6,255,922 B1 * | 7/2001 | Malmstrom et al. | 333/219.1 |
| 6,337,611 B1 * | 1/2002 | Hult | 333/202 |
| 6,353,373 B1 * | 3/2002 | Liang et al. | 333/202 |
| 6,362,707 B1 * | 3/2002 | Reinhardt | 333/219.1 |
| 6,362,708 B1 * | 3/2002 | Woods | 333/234 |
| 6,367,580 B1 * | 4/2002 | Chang | 181/241 |
| 6,384,699 B1 * | 5/2002 | Henningsson et al. | 333/224 |
| 6,404,307 B1 * | 6/2002 | Wulff | 333/207 |
| 6,435,565 B2 * | 8/2002 | Potts et al. | 285/124.1 |
| 6,441,705 B1 * | 8/2002 | Costa et al. | 333/229 |
| 6,464,421 B1 * | 10/2002 | Kiefer | 403/21 |
| 6,522,225 B2 * | 2/2003 | Liang et al. | 333/202 |
| 6,559,656 B2 * | 5/2003 | Doi | 324/636 |
| 6,600,393 B1 * | 7/2003 | Pahlman et al. | 333/234 |
| 6,600,394 B1 * | 7/2003 | Wang et al. | 333/235 |
| 6,649,821 B2 * | 11/2003 | Inoue | 84/423 R |
| 6,669,424 B1 * | 12/2003 | Bauer | 411/433 |
| 7,005,951 B2 * | 2/2006 | Motooka et al. | 333/235 |
| 7,012,488 B2 * | 3/2006 | Beis et al. | 333/233 |
| 2001/0011937 A1 * | 8/2001 | Satoh et al. | 333/235 |
| 2001/0018014 A1 * | 8/2001 | Ito | 411/288 |
| 2002/0084874 A1 * | 7/2002 | Liang et al. | 333/202 |
| 2003/0090336 A1 * | 5/2003 | Radzikowski et al. | 333/100 |
| 2003/0117229 A1 * | 6/2003 | Remillard | 333/99 S |
| 2003/0137368 A1 * | 7/2003 | Saito et al. | 333/202 |
| 2003/0147716 A1 * | 8/2003 | Nagawa et al. | 411/288 |
| 2003/0193379 A1 * | 10/2003 | Lye et al. | 333/203 |
| 2004/0005125 A1 * | 1/2004 | Anderson | 385/88 |
| 2004/0036557 A1 * | 2/2004 | Yamakawa et al. | 333/202 |
| 2004/0113723 A1 * | 6/2004 | Motooka et al. | 333/202 |
| 2004/0145432 A1 * | 7/2004 | Yamakawa et al. | 333/202 |
| 2004/0263289 A1 * | 12/2004 | Cobb | 333/231 |
| 2005/0113258 A1 * | 5/2005 | Kai et al. | 505/210 |
| 2005/0212623 A1 * | 9/2005 | Ala-Kojola | 333/202 |
| 2005/0219013 A1 * | 10/2005 | Kumar et al. | 333/203 |
| 2006/0071737 A1 * | 4/2006 | Puoskari | 333/203 |

* cited by examiner

TUNING SCREW ASSEMBLY

FIELD OF THE INVENTION

The present invention relates to a tuning screw assembly, to a method of manufacturing said tuning screw assembly and to a resonator comprising said tuning screw assembly.

DESCRIPTION OF THE RELATED ART

In many applications there is a need for mounting a tuning screw with the ability to later on easily adjust the position of the tuning screw. For example, in dielectric resonators, a commonly used method is to secure the tuning screw by using an ordinary locking nut which is tightened to an adjacent surface. This way of securing the tuning screw is rather time consuming and, therefore, some alternative ways of locking such a screw have been provided.

In U.S. Pat. No. 4,305,113, there is described a screw body forming a rotary part of a capacitor including an outer sleeve forming a hollow cylindrical stationary part of the capacitor. The massive screw body has externally threaded portions. These external threaded portions are axially separated by an unthreaded intermediate portion of reduced diameter. The intermediate portion is provided with three deep slots extending inwardly passed the central axis, leaving three angularly displaced web portions. The intermediate portion is slightly deformed axially to misalign the two threaded portions of the screw body. When the screw is screwed into an outer sleeve, the misaligned threaded portions are forced into axial alignment in order to frictionally lock the screw in said sleeve.

Now, the problem to be solved with the present invention is to provide a tuning screw assembly, an which the tuning screw can be properly adjusted, if needed a relatively long axial distance, while retaining a well-defined frictional locking of the screw within the surrounding sleeve. In many practical cases involving the tuning of high frequency resonators, it is necessary to allow for a long axial range of movement of the tuning screw. Hereby, it is possible to compensate for tolerances in the design and manufacture of the resonator.

A drawback with the frictionally locking device as described in said U.S. patent (as far as it can be understood from the specification) is that it may not be possible to frictionally lock a relatively long screw and to enable a long axial movement of the screw within the sleeve. One possible solution, although not mentioned in the US patent specification, could be to provide the screw with a plurality of misaligned portions along the screw. Alternatively, both the sleeve and the screw could be made relatively long, so that the axially spaced threaded portions on both sides of the intermediate, slotted portion are always in threaded engagement with the sleeve.

Furthermore, it seems difficult to obtain a cost-effective way of manufacturing the screw described in said U.S. patent specification, especially with regard to forming the deep slots after cutting the external thread.

SUMMARY OF THE INVENTION

It is an object of the present invention to provide an improved tuning screw assembly, a method of manufacturing said assembly and a resonator, which overcome or at least reduce the above mentioned problems with the prior art devices.

According to a first aspect of the present invention, there is provided a tuning screw assembly as claimed in claim 1.

According to a second aspect of the present invention, there is provided a method for manufacturing said tuning screw assembly, as claimed in claim 13.

According to a third aspect of the present invention, there is provided a resonator as claimed in claim 17.

One advantage with the tuning screw assembly according to the present invention is that the same sleeve can be used for any length of the screw to be locked.

Another advantage with the tuning screw assembly according to the present invention is that it is relatively easy and inexpensive to manufacture.

Yet another advantage with the tuning screw assembly according to present invention is that the internal forces will keep the screw in position during the lifetime of the assembly or until the position of the tuning screw has to be changed.

Still another advantage with the tuning screw assembly according to the present invention is that the tuning screw can be adjusted precisely to another position within a relatively long axial range.

A further advantage with the tuning screw assembly according to the present invention is that it can be mounted onto a frame or a top wall of a resonator in a quick and easy manner, making the production inexpensive. The effective resiliency of the intermediate part of the sleeve will ensure a good and lasting electrical contact between the sleeve and the screw, especially at the bottom end of the sleeve, which is very important for high frequency applications.

The invention will now be described in more detail with regard to preferred embodiments thereof and also with reference to the accompanying drawings.

DESCRIPTION OF A PREFERRED EMBODIMENT

In accordance with the present invention, a cylindrical sleeve is provided with two axially displaced, internally threaded portions which engage with the external thread of a tuning screw so as to effect frictional locking thereof and electrical coupling in high frequency applications.

Figure 1:
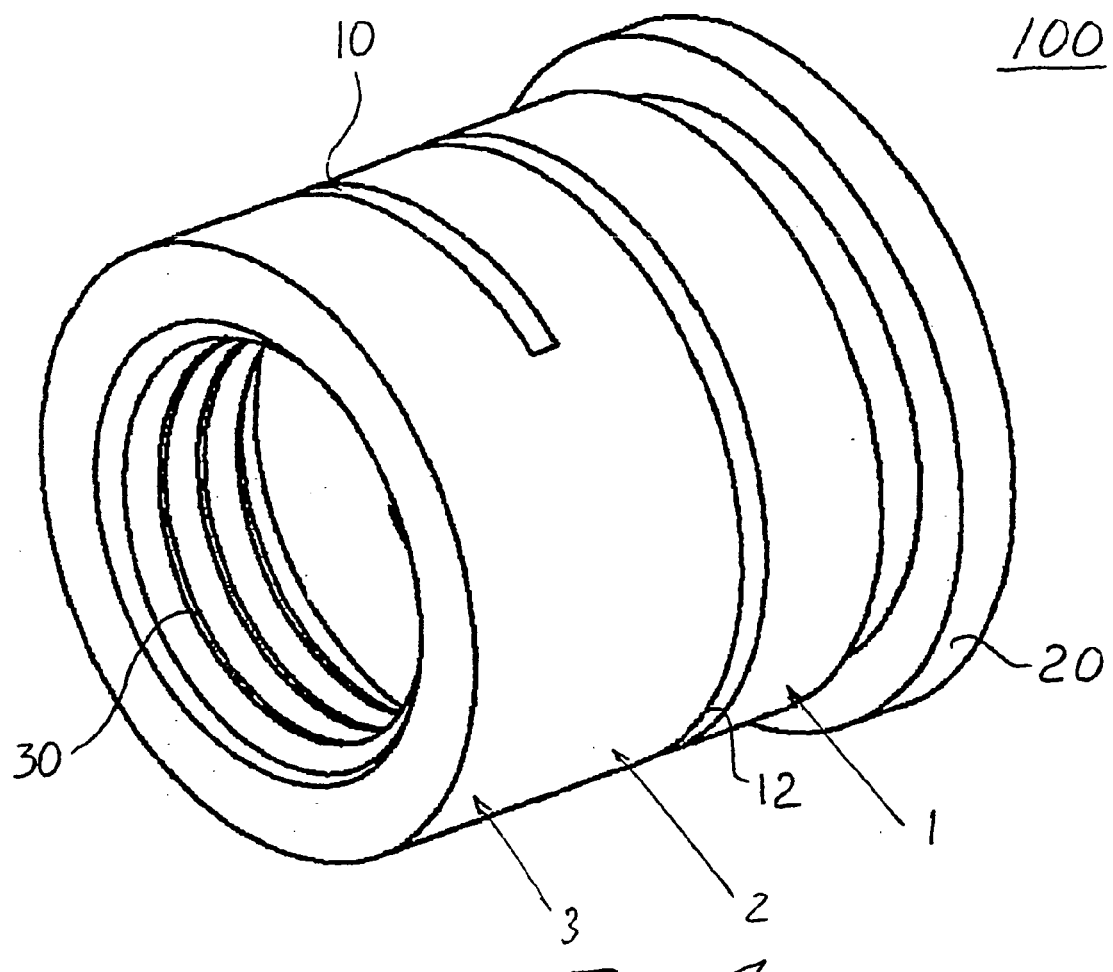
FIG. 1 shows a first perspective view of an embodiment of a sleeve forming part of a tuning screw assembly according to the invention before a deformation is made in a direction parallel to its central axis.
Figure 2:
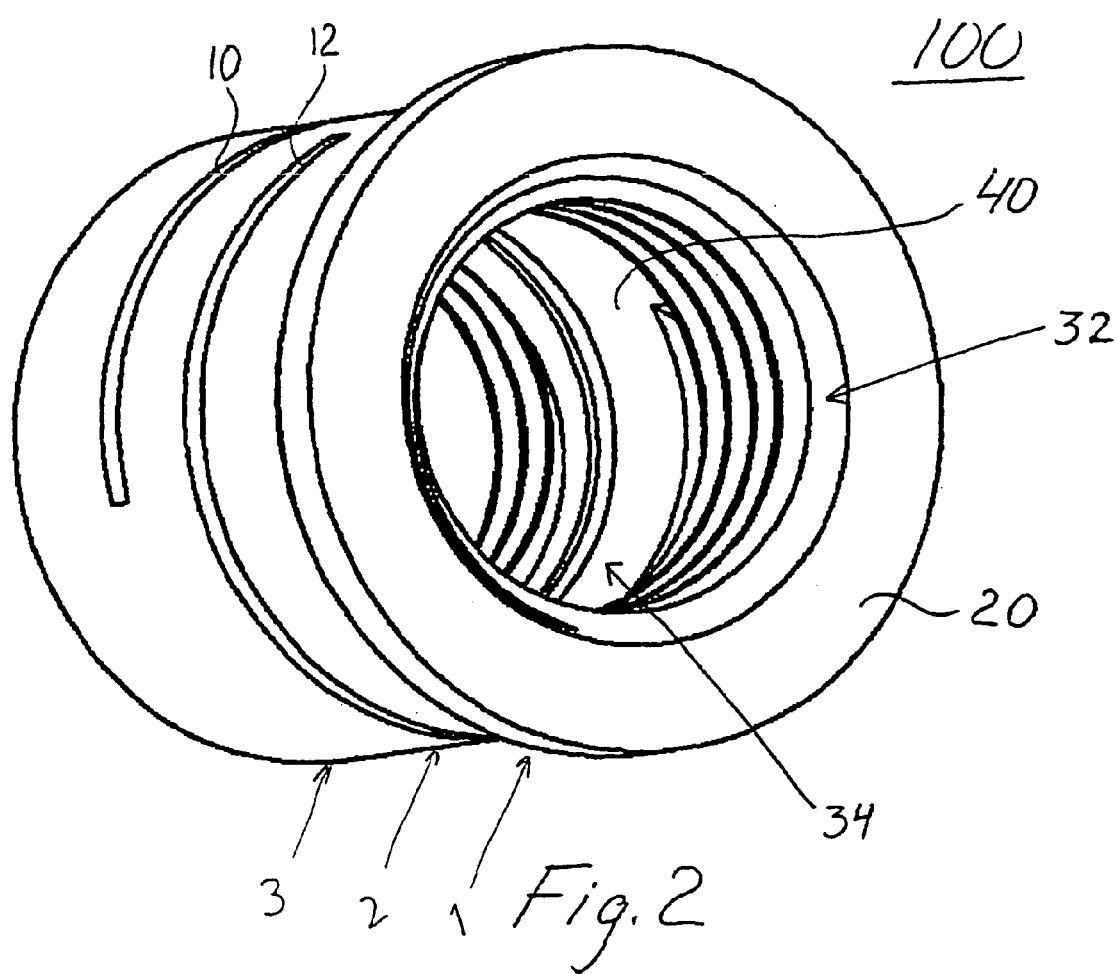
FIG. 2 shows a second perspective view of the embodiment of the sleeve shown in FIG. 1.

FIG. 1 and 2 show two different perspective views of a sleeve 100, forming part of a tuning screw assembly 100,200

(shown in FIGS. 7 and 8) according to the invention, before being deformed in a direction parallel to its central axis. The sleeve 100 comprises a first axial part 1, an intermediate axial part 2 and a second axial part 3. A first slot 10 and a second slot 12 are located in said intermediate axial part 2. There is an optional flange 20 in said first axial part 1. Internally, threads 30 are provided, including a first threaded portion 32 in said first axial part 1 and a second threaded portion 34 in said second axial part 3, and there is an unthreaded portion 40 in said intermediate axial part 2.

In this embodiment, the outer shape of the sleeve 100 is cylindrical. Alternatively the outer shape of the sleeve may have any shape, for example a splined cylindrical outer surface or a hexagonal outer surface (like an ordinary nut).

The first threaded portion 32 and the second threaded portion 34 are axially separated from each other by said unthreaded portion 40 in the intermediate axial part 2 of the sleeve 100. The unthreaded portion 40 comprises in this embodiment said first slot 10 and said second slot 12. As appears from FIGS. 3 and 4, the first and second slots 10,12 extend substantially circumferentially in the cylindrical wall of the sleeve and are located in planes oriented essentially at right angle to a central axis of the sleeve.

Figure 3:
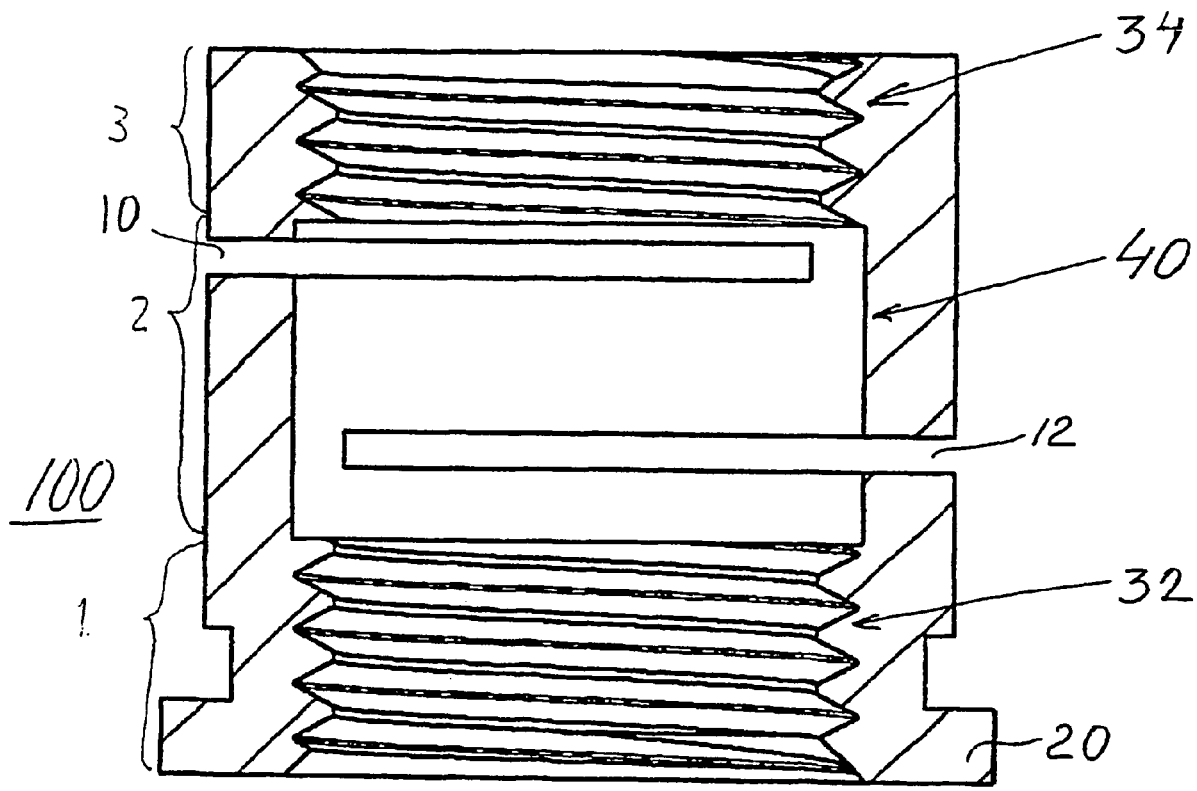
FIG. 3 shows a cross sectional side view of the sleeve shown in FIGS. 1 and 2.
Figure 4:
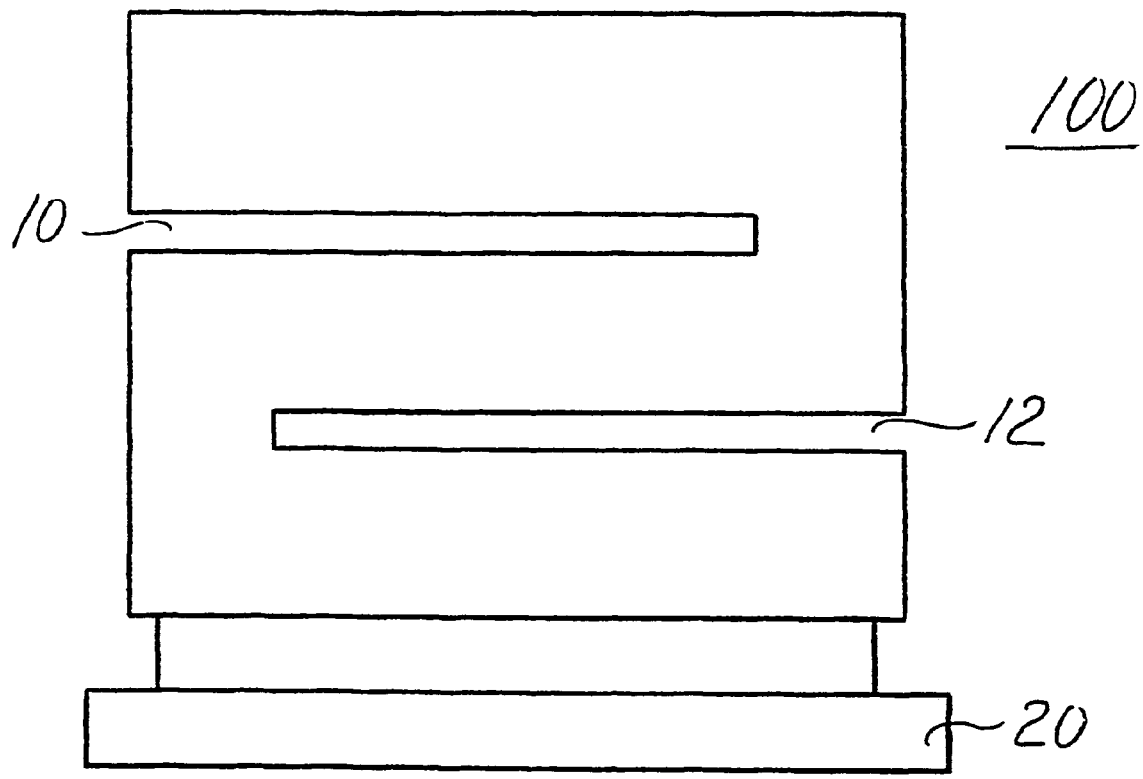
FIG. 4 shows a side view of the sleeve shown in FIGS. 1–3.

The threaded portions 32, 34 can be formed by first making a continuous, uniform internal thread in the sleeve 100 and cutting out, e.g. in a turning process, an intermediate recess 40, whereupon through-going circumferential slots 10 and 12 are made in the cylindrical wall (FIGS. 3 and 4). Thereupon, in order to displace the threaded portions 32, 34 axially in relation to each other, the sleeve is deformed axially so as to slightly change the axial distance between the first and second threaded portions 32, 34.

Figure 5:
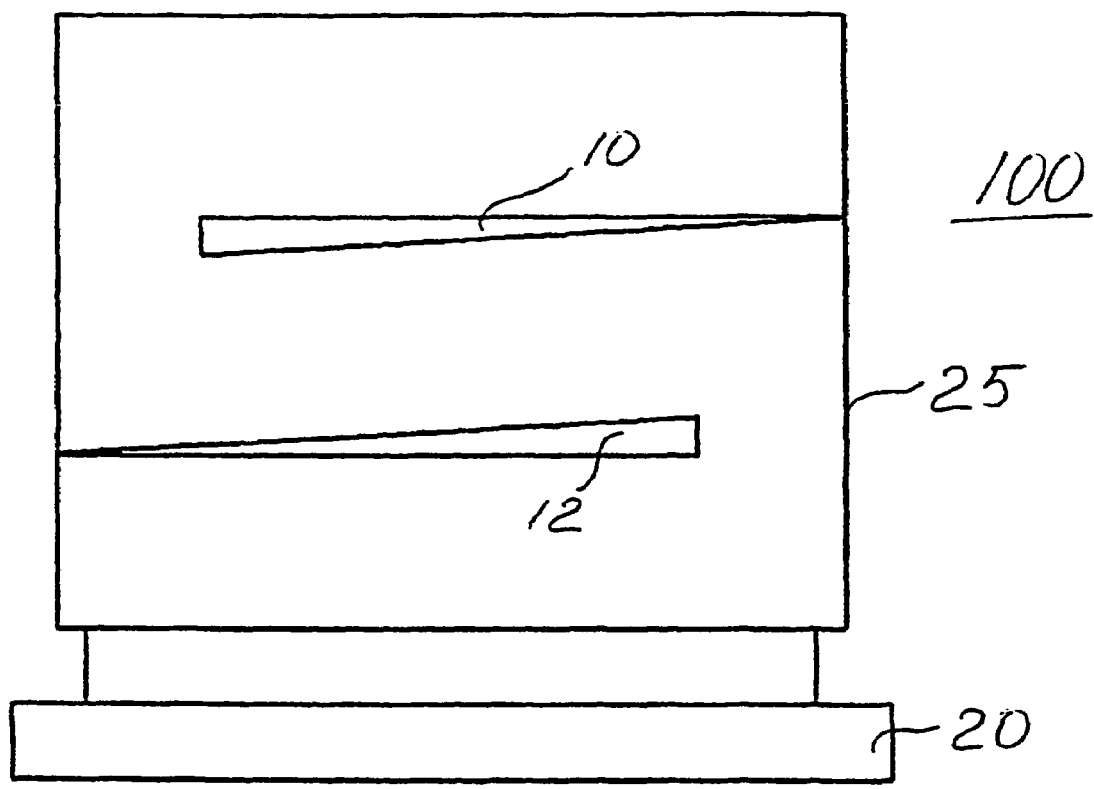
FIG. 5 shows a side view of the sleeve of FIG. 4 upon being deformed in a direction parallel to its central axis.

FIG. 5 shows the sleeve 100 upon being deformed in a direction parallel to its central axis. During the deformation, which in this case is a compression, the slots 10,12 are totally compressed in the outer surface 25 of the sleeve 100. Accordingly, each slot is deformed, as seen in the side view in FIG. 5, into a tapered section forming an elongated triangle with an acute angle.

Figure 6:
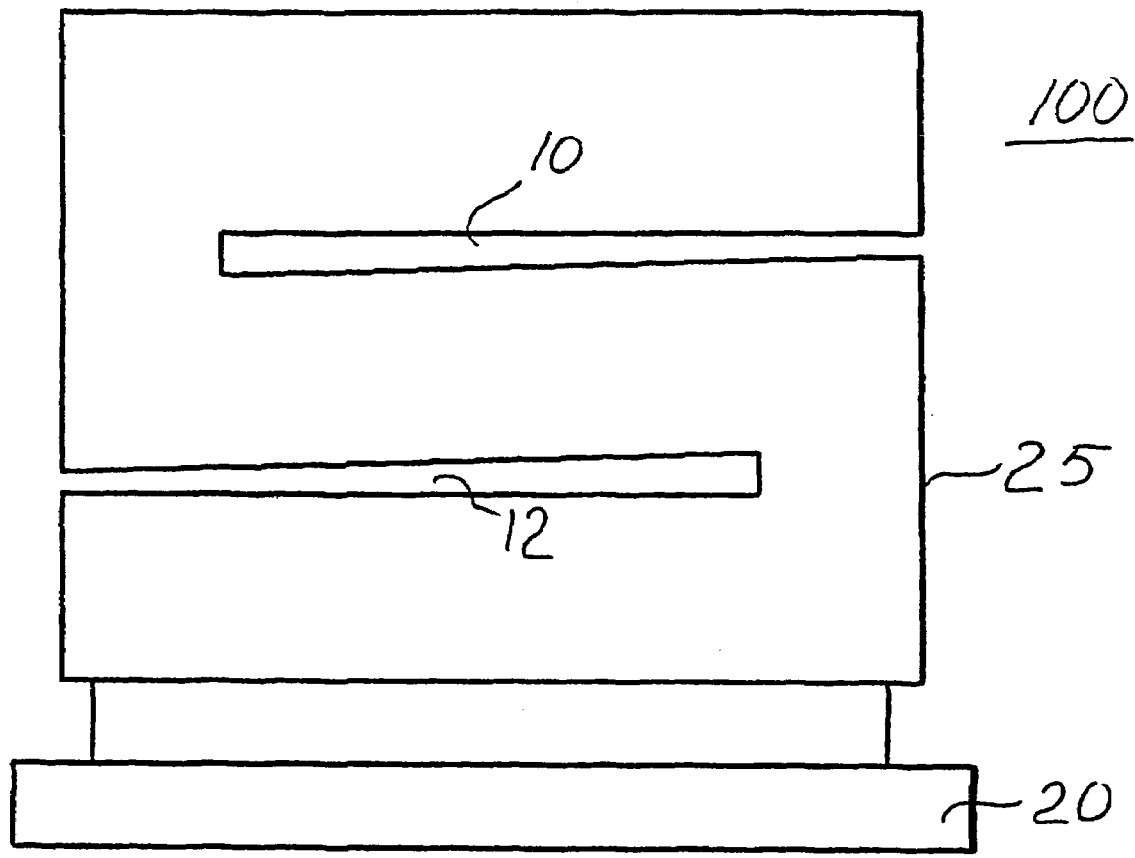
FIG. 6 shows a side view of the sleeve of FIG. 5 after partially resuming its original configuration.

Then, as illustrated in FIG. 6, the sleeve 100 is unloaded so as to freely change its shape and to partially resume its original geometrical configuration due to the elastic-plastic behaviour of the metallic material of the sleeve. Accordingly, the slots will not remain totally compressed. Furthermore, by choosing a specific width of the slot, one can predict the final free width of the slot after the compression stage. The first and second threaded portions 32,34 will be permanently displaced axially after the compression stage. The displacement will cause a frictional locking effect if and only if the original width of the slot minus said free width of the slot after compression and relation differs from the pitch of the thread (the distance between two adjacent threads).

Figure 7:
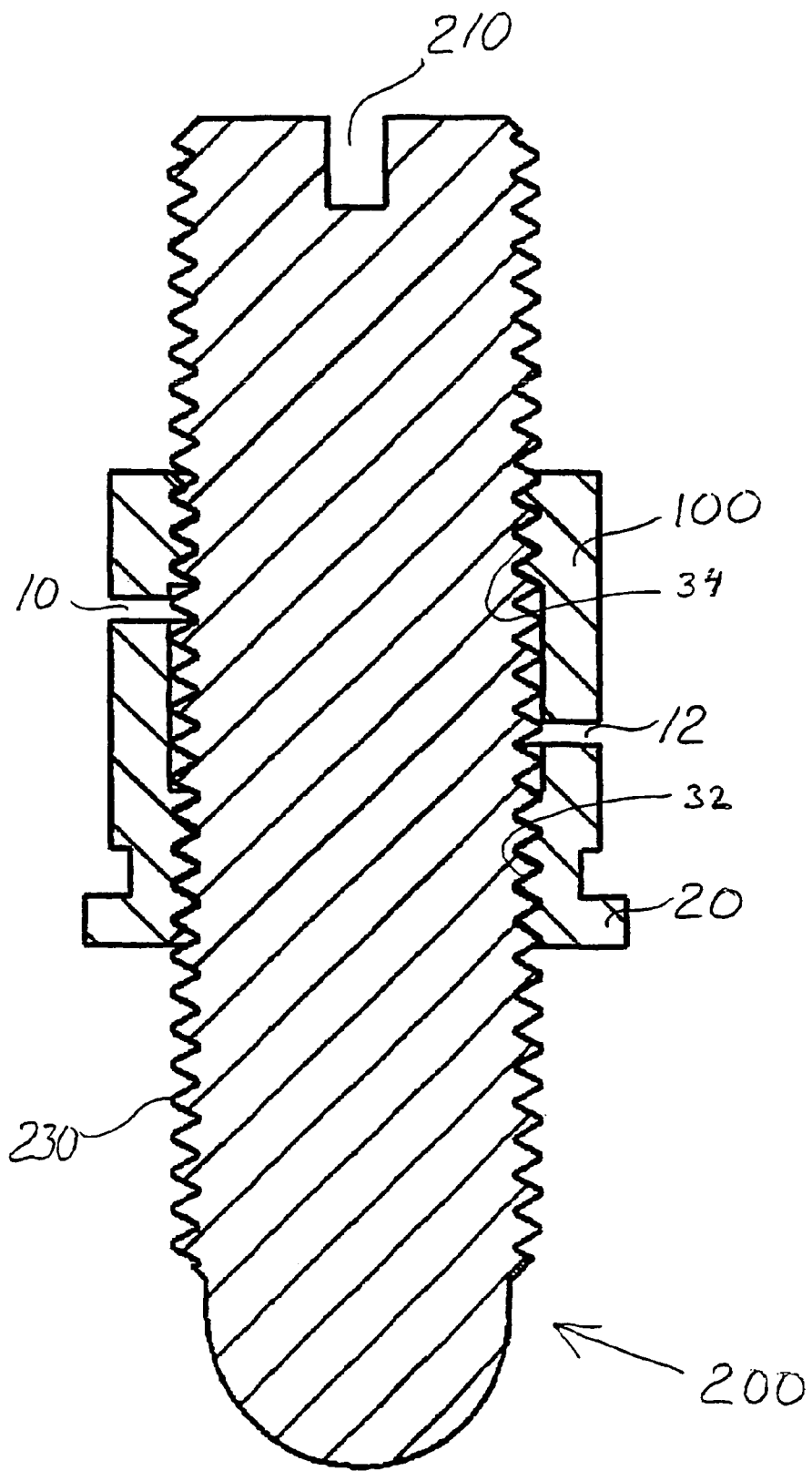
FIG. 7 shows a cross sectional side view of the embodiment of a tuning screw assembly including a sleeve as shown in FIGS. 1–4.

As explained above, the axially displaced first and second threaded portions 32,34 will give rise to an axial force therebetween upon engagement with the uniform external thread of the associated tuning screw and will therefore function as a friction lock for the assembly (FIG. 7).

In the illustrated embodiment, only two slots are shown. Of course, any suitable number of slots may be formed in the intermediate unthreaded portion 40.

In an alternative embodiment, the slots may be formed in the threaded portion in addition to the slot(s) in the unthreaded portion or, as a further alternative, instead of the slots in the unthreaded portion 40. When using slots in the threaded portions only, the unthreaded portion may be excluded.

In order to reduce the frictional forces and facilitate the tuning process, it has turned out to be very advantageous to apply a frictional reducing agent in the threads, as for example grease, silicon spray or some other suitable material. In this way, the starting friction will be drastically reduced, and the tuning operation can be effected smoothly and with an even torque applied to the tuning screw.

In order to accomplish the axial displacement of the threaded portions, one can expand the sleeve instead of compressing it. When expanding the sleeve, however, there is no easy way to know exactly what the result will be, i.e. it is difficult to control the magnitude of the permanent elongation.

Another way to bring said first and said second threaded portions axially displaced relative to each other is to form said first threaded portion from one end of the sleeve and stop before reaching the opposite end. Thereafter, the second threaded portion is formed from the opposite end, possibly in a separate step. By stopping the threading before reaching the first threaded portion, an unthreaded portion is obtained therebetween. Of course, the distance between the threaded portions has to differ from a multiple number of the distance between two adjacent threads in order to achieve the desired axial displacement.

FIG. 7 shows the tuning screw assembly with a tuning screw 200 in threaded engagement with a surrounding sleeve 100 of the kind described above. The tuning screw 200 has a uniform external thread 230, which corresponds in terms of pitch etc. to the threads 30 in the sleeve 100. The screw 200 has a transversal groove 210 at its outer, upper end portion to receive a screwdriver for rotating the screw 200. As explained above, the displaced internally threaded portions of the sleeve 100 will frictionally lock the tuning screw in any set position.

Figure 8:
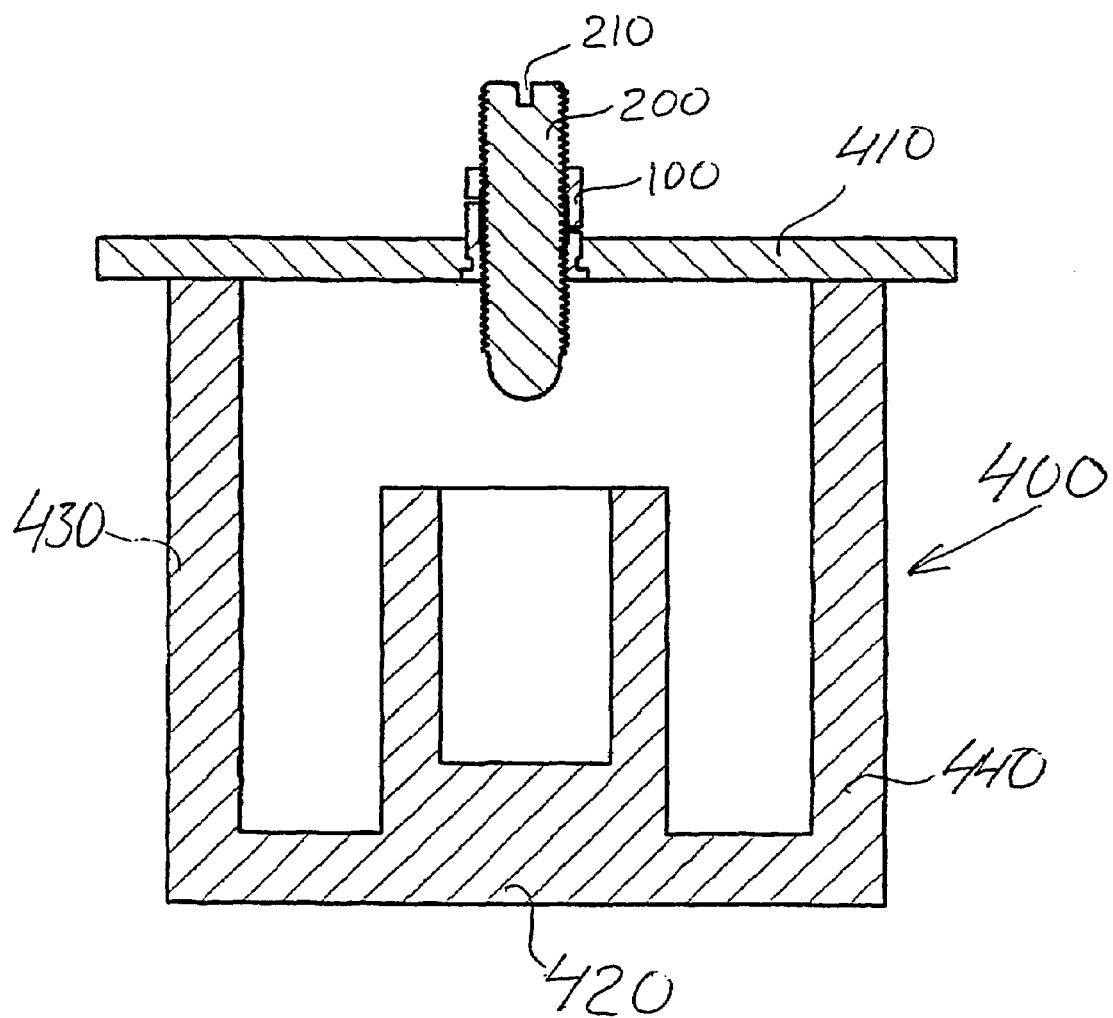
FIG. 8 shows a cross sectional view of the tuning screw assembly of FIG. 7 being mounted in the lid of a resonator body.

FIG. 8 illustrates a practical application, where the tuning screw assembly 100,200 is mounted in the lid 410 of a resonator body 400. The assembly may be attached by means of press fit, soldering or some other kind of fastening. Of course, a press fit will enable a very quick and inexpensive manufacturing process with a low number of parts to be assembled.

The resonator body 400 defines a cavity inside said lid 410, a bottom wall 420 and side walls 430, 440. By changing the rotary position of the tuning screw 200, the resonating frequency of said resonator may be adjusted.

The tuning screw assembly may be modified within the scope of the appended claims. For example, there may be more than two displaced threaded portions. Moreover, each threaded portion does not have to be uniform, e.g. in case the cylindrical wall of the sleeve is not uniformly thick and is deformed by a strong compressive or expansive force in the part provided with the internal threaded portion.

The invention claimed is:

1. A tuning screw assembly in combination with a resonator having a resonator cavity inside a frame or housing (400), comprising a stationary, internally threaded sleeve member (100) being in threaded engagement with a central, externally threaded tuning screw member (200), which extends into said resonator cavity and is rotatable within said sleeve member against a frictional locking force exerted between the mutually engaging threads so as to adjust the resonating frequency of said resonator, characterized in that
the sleeve member (100) comprises a first axial part (1) provided with a first threaded portion (32), an unthreaded intermediate axial part (2), and a second axial part (3), which is provided with a second threaded portion (34), wherein said sleeve member (100) has a substantially uniform cylindrical outer shape, is formed of a single integral piece, and is provided with at least one tapered slot (10, 12) through the wall thereof in said unthreaded intermediate axial part (2), so as to make the unthreaded intermediate axial part (2) resilient in the axial direction, said first and second threaded portions (32, 34) of the sleeve member (100) are axially misaligned relative to each other in such a way that they do not fit exactly with the external thread (23) of the tuning screw (200), said first axial part (1) of the sleeve member (100) is attached to said resonator frame or a housing (400), whereas said second axial part (3) of the sleeve member is resiliently movable in the axial direction, because of the resiliency of the intermediate axial part (2), so as to engage with the external thread (230) of the screw member (200) and achieve said frictional locking force upon adjustment of the resonating frequency of said resonator.

2. The tuning screw assembly in combination with a resonator according to claim 1, wherein a frictional reducing agent is applied to any of the mutually engaging threads.

3. The tuning screw assembly in combination with a resonator according to claim 1, wherein said unthreaded intermediate axial part (2) comprises an internal recess (40) in the wall of the sleeve member (100).

4. The tuning screw assembly in combination with a resonator according to claim 1, wherein said slot (10, 12) extends substantially circumferentially in said wall.

5. The tuning screw assembly in combination with a resonator according to claim 1, wherein the sleeve member (100) is axially shorter than the central screw member (200).

6. The tuning screw assembly in combination with a resonator according to claim 1, wherein said first axial part (1) of the sleeve member (100) is shaped so as to enable mounting thereof in said frame or housing (410) with a press fit.

7. The tuning screw assembly of claim 1, wherein the sleeve member (100) is provided with more than one slot (10, 12).

8. A resonator comprising a tuning screw assembly (100, 200) as defined in claim 1, said sleeve member (100) being securely fastened to a said frame or housing (400) of the resonator.

9. The resonator according to claim 8, wherein said sleeve member (100) is fastened to a wall (410) of said housing (400) by a press fit.

10. The tuning screw assembly in combination with a resonator according to claim 1, wherein said intermediate axial part (2) of the sleeve (100) is permanently deformed axially.

11. The tuning screw assembly in combination with a resonator according to claim 10, wherein said intermediate axial part (2) is permanently compressed axially.

12. The tuning screw assembly in combination with a resonator according to claim 10, wherein said intermediate axial part (2) is permanently expanded axially.

13. A method for manufacturing an internally threaded sleeve member (100) forming a part of a tuning screw assembly (100, 200) in combination with a resonator having a resonator cavity inside a frame or housing (400), said assembly also including an externally threaded tuning screw member (200) for adjusting the resonating frequency of said resonator, said screw member extending into said resonator cavity, characterized by the steps of providing first and second axial parts (1, 3) of said sleeve member (100) with first and second internally threaded portions (32, 34), providing the sleeve member (100) formed of a single integral piece with an unthreaded intermediate resilient axial part (2) between said first and second internally threaded portions (32, 34) and having at least one tapered slot (10, 12) through the wall thereof in said unthreaded intermediate axial part (2) so as to make the unthreaded intermediate axial part resilient in the axial direction, providing a relative axial misalignment of said first and second internally threaded portions (32, 34) in such a way that they do not fit exactly with the external thread (230) of said tuning screw member (200), whereby a frictional locking of said tuning screw member is achieved when being in threaded engagement with said sleeve member, because of the resiliency of said intermediate axial part (2) of the sleeve member (100) and the axial deformation of said intermediate part, and mounting said first axial part (1) of said sleeve member in said resonator frame or housing (400) so that said tuning screw member extends into said resonator cavity and enables a sustainable adjustment of the resonating frequency of said resonator.

14. The method of claim 13, wherein the sleeve member (100) is provided with more than one slot (10, 12).

15. The method according to claim 13, wherein said sleeve member (100) is first provided with a uniform internal thread, whereupon said intermediate, resilient axial part (2) of the sleeve member (100) is permanently deformed axially so as to displace said first and second internally threaded portions (32, 34) relative to each other.

16. The method according to claim 15, wherein at least one slot (10, 12) is made in said intermediate axial part (2) of the sleeve member (100) before it is deformed axially.

17. The method according to claim 13, wherein said first and second threaded portions (32, 34) are formed separately.

18. The method according to claim 17, wherein said misalignment is provided when forming said first and second threaded portions (32, 34).

* * * * *